(12) United States Patent
    Kirby et al.

(10) Patent No.: US 9,449,906 B2
(45) Date of Patent: Sep. 20, 2016

(54) DEVICES, SYSTEMS, AND METHODS RELATED TO FORMING THROUGH-SUBSTRATE VIAS WITH SACRIFICIAL PLUGS

(71) Applicant: Micron Technology, Inc., Boise, ID (US)

(72) Inventors: Kyle K. Kirby, Eagle, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/514,184

(22) Filed: Oct. 14, 2014

(65) Prior Publication Data

US 2015/0028476 A1     Jan. 29, 2015

Related U.S. Application Data

(62) Division of application No. 13/652,033, filed on Oct. 15, 2012, now Pat. No. 8,859,425.

(51) Int. Cl.
    *H01L 23/498*     (2006.01)
    *H01L 23/48*     (2006.01)
    (Continued)

(52) U.S. Cl.
    CPC ... *H01L 23/49827* (2013.01); *H01L 21/76898* (2013.01); *H01L 23/481* (2013.01); *H01L 23/49811* (2013.01); *H01L 24/05* (2013.01); *H01L 2224/0401* (2013.01); *H01L 2224/04042* (2013.01); *H01L 2224/0557* (2013.01);
    (Continued)

(58) Field of Classification Search
    CPC ........... H01L 23/481; H01L 21/76898; H01L 2224/94; H01L 23/49827; H01L 23/49811; H01L 24/05; H01L 2224/0401; H01L 2224/04042; H01L 2224/0557; H01L 2224/131; H01L 2224/13025
    See application file for complete search history.

(56) References Cited

U.S. PATENT DOCUMENTS 6,137,130 A    10/2000  Sung
6,153,518 A    11/2000  Abbott et al.
    (Continued)

FOREIGN PATENT DOCUMENTS

JP    2006012953 A    1/2006
JP    2006060067 A    3/2006
    (Continued)

OTHER PUBLICATIONS

International Search Report and Written Opinion issued Jan. 28, 2014 in International Application No. PCT/US2013/064915, 12 pages.
    (Continued)

*Primary Examiner* — Roy Potter
(74) *Attorney, Agent, or Firm* — Perkins Coie LLP

(57) ABSTRACT

Methods for making semiconductor devices are disclosed herein. A method configured in accordance with a particular embodiment includes forming one or more openings in a front side of the semiconductor device and forming sacrificial plugs in the openings that partially fill the openings. The method further includes further filling the partially filled openings with a conductive material, where individual sacrificial plugs are generally between the conductive material and a substrate of the semiconductor device. The sacrificial plugs are exposed at a backside of the semiconductor device. Contact regions can be formed at the backside by removing the sacrificial plugs.

17 Claims, 14 Drawing Sheets

(51) Int. Cl.
*H01L 21/768* (2006.01)
*H01L 23/00* (2006.01)

(52) U.S. Cl.
CPC .............. *H01L2224/131* (2013.01); *H01L 2224/13025* (2013.01)

(56) References Cited

U.S. PATENT DOCUMENTS

| | | | |
|---|---|---|---|
| 6,326,293 | B1 | 12/2001 | Fang et al. |
| 7,268,039 | B2 | 9/2007 | Fishburn et al. |
| 7,291,556 | B2 | 11/2007 | Choi et al. |
| 7,998,853 | B1 | 8/2011 | Rahman |
| 8,021,981 | B2 | 9/2011 | Pratt |
| 8,426,308 | B2 | 4/2013 | Han et al. |
| 8,592,988 | B2 | 11/2013 | Lee et al. |
| 2002/0148639 | A1 | 10/2002 | Smith et al. |
| 2005/0009329 | A1 | 1/2005 | Tanaka et al. |
| 2007/0284729 | A1 | 12/2007 | Kwon et al. |
| 2008/0020488 | A1 | 1/2008 | Clevenger et al. |
| 2009/0283871 | A1 | 11/2009 | Chang et al. |
| 2011/0089572 | A1 | 4/2011 | Tezcan et al. |
| 2012/0056330 | A1 | 3/2012 | Lee et al. |
| 2012/0094437 | A1 | 4/2012 | Han et al. |
| 2012/0098122 | A1 | 4/2012 | Yang |
| 2012/0153498 | A1* | 6/2012 | Kang ............... H01L 23/3114 257/774 |
| 2014/0103520 | A1 | 4/2014 | Kirby et al. |

FOREIGN PATENT DOCUMENTS

| | | |
|---|---|---|
| JP | 2007005787 A | 1/2007 |
| JP | 2007318143 A | 12/2007 |
| JP | 2008270354 A | 11/2008 |
| JP | 2011071516 A | 4/2011 |
| KR | 20040098539 A | 11/2004 |
| KR | 20060054689 | 5/2006 |
| KR | 1020080090826 A | 10/2008 |
| KR | 20120025081 | 3/2012 |
| KR | 20120030782 A | 3/2012 |
| WO | 2012048973 A1 | 4/2012 |

OTHER PUBLICATIONS

Office Action mailed Jan. 4, 2016 in Korea Application No. 10-2015-7012547, 12 pages.
Office Action mailed Jul. 24, 2015 in Taiwan Application No. 102137185, 18 pages.
Extended European Search Report mailed Apr. 28, 2016 in European Patent Application No. 13847701.3, 10 pages.
Office Action mailed May 17, 2016 in Japanese Patent Application No. 2015-536995, 7 pages.

* cited by examiner

DEVICES, SYSTEMS, AND METHODS RELATED TO FORMING THROUGH-SUBSTRATE VIAS WITH SACRIFICIAL PLUGS

CROSS-REFERENCE TO RELATED APPLICATIONS

The present application is a divisional of U.S. application Ser. No. 13/652,033 filed Oct. 15, 2012, now U.S. Pat. No. 8,859,425, which is incorporated herein by reference.

TECHNICAL FIELD

The present technology is related to forming through-substrate vias that extend through the substrates of semiconductor devices. In particular, some embodiments of the present technology are related to forming through-silicon vias (TSVs).

BACKGROUND

Forming semiconductor devices typically includes subjecting a semiconductor substrate or assembly to a series of processing steps, each directed to adding, removing, and/or altering material. Cumulatively, these processing steps can form electrical components, e.g., transistors, capacitors, and diodes, precisely and at very high densities. Networks of electrical connections between the electrical components can be complex and, in modern semiconductor devices, typically extend over multiple layers. Connections from one layer to another layer can be formed by vias, which are formed selectively by etching holes through the substrate in desired patterns. Through-substrate vias extend through the entirety of a semiconductor device or substrate and electrically couple contacts or other features at opposite sides of the semiconductor device. Conventionally, a multi-step process is used to form through-substrate vias, which includes forming the vias through a front side of the semiconductor device and then backgrinding or thinning the backside until the vias are exposed through the backside.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
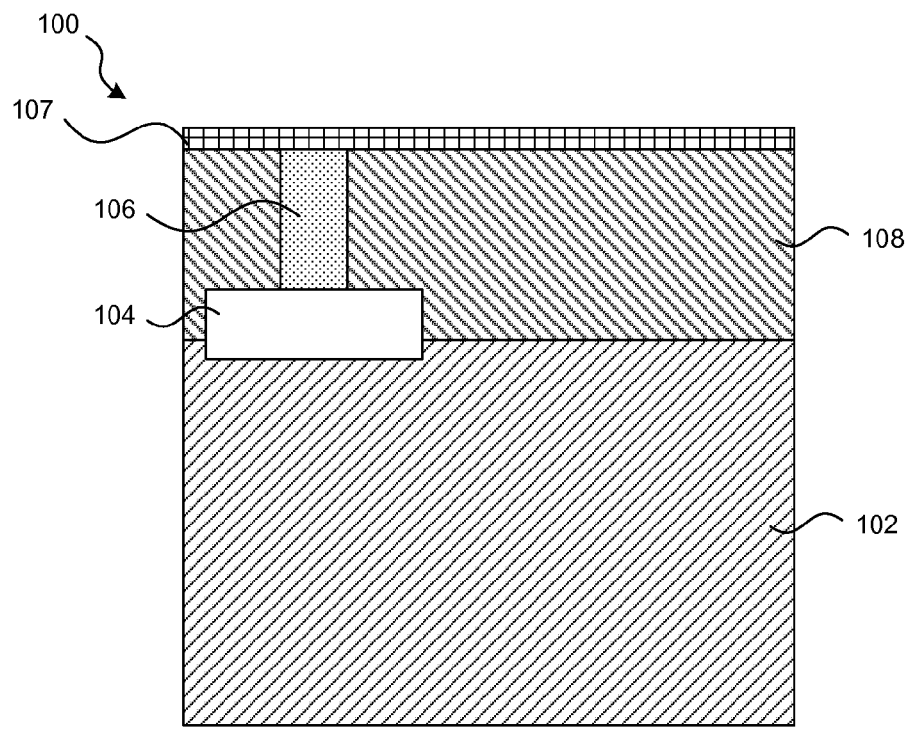
FIGS. 1-14 are partially schematic cross-sectional views illustrating a semiconductor device at selected steps in a method for making conductive structures in accordance with an embodiment of the present technology.

Specific details of several embodiments of methods for making semiconductor devices are described herein along with related methods, devices, and systems. The term "semiconductor device" generally refers to a solid-state device that includes semiconductor material. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of through-substrate vias (e.g., through-silicon vias), such as electrically conductive plugs or connectors that extend completely through the substrate when completed. A person having ordinary skill in the relevant art will also understand that the present technology may have additional embodiments, such as embodiments including other electrical connectors in a wafer, and that the present technology may be practiced without several of the details of the embodiments described herein with reference to FIGS. 1-19. For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading may be used to indicate materials in cross section that can be compositionally similar, but the use of the same shading does not imply that the materials should be construed to be identical.

Through-substrate vias are fabricated by forming holes in a substrate, filling the holes with a conductive material, and then thinning the substrate at the backside to expose the conductive material through the backside of the substrate. The process for forming the holes can include a photolithographic process followed by one or more wet and/or dry chemical etch processes. Typically this process creates a certain amount of variation in hole depth across a wafer or die. For example, the variation can be on the order of two thousand angstroms or more. The thinning process is generally designed to accommodate theses variations. For example, a backgrinding process may be carried out for additional time to ensure that all of the through-substrate vias extend completely through the substrate. However, because the through-substrate vias are typically composed of soft metal, this can result in the smearing of metal across the substrate. This smeared metal can adversely impact device performance, such as by creating electrical shorts. Copper, for example, is very mobile, and copper that is smeared across the substrate can diffuse to the transistor level. In addition, backgrinding and other thinning processes also have a certain amount of variation. This further contributes to the amount of time required to ensure that all of the through-substrate vias are exposed through the backside of the substrate.

Methods in accordance with embodiments of the present technology can include forming a sacrificial plug in the initial opening of a through-substrate via. The sacrificial plug can include, for example, a polysilicon plug that is positioned between the conductive material and the bottom of the initial opening. This sacrificial plug can have a height that compensates for any variation in etching or other manufacturing processes, such as wafer thinning. The sacrificial plug can also protect the through-substrate via during a backgrinding or other thinning process. The sacrificial plug is expected to eliminate several problems associated with metal smearing at the backside of the substrate. This in turn can improve device performance as well as yield. Further, the sacrificial plug can be removed to define a contact region, such as an opening or void, for forming a structure at the backside of the substrate. For example, the backside can be patterned to form a conductive pillar or stand-off structure (e.g., metal structure) that is electrically coupled with the conductive material through the void. Such a structure can extend beyond the substrate surface at the backside of the device. In another example, the backside can include a damascene structure that is electrically coupled with the conductive material through the void.

FIGS. 1-14 are partially schematic cross-sectional views illustrating a portion of a semiconductor device 100 in a method for making through-substrate vias or other connectors in accordance with an embodiment of the present technology. FIGS. 1-8 illustrate the semiconductor device 100 in various stages of forming a front-side portion of through-substrate vias or other connectors. As shown in FIG. 1, the semiconductor device 100 can include a substrate 102, an electrical component 104 (shown schematically), and an electrode 106 extending from the electrical component 104 through a dielectric region 108. The electrical component 104 can be a transistor (e.g., a bipolar or field-effect transistor), a diode, a capacitor, or another suitable solid-state component formed in and/or on the substrate 102. In some embodiments, the electrode 106 can be a gate electrode and the semiconductor device 100 can further include a source electrode (not shown) and a drain electrode (not shown). Suitable materials for the electrode 106 include tungsten, among others. In some embodiments, the electrode 106 can include a stack of conductive materials, such as a stack of metal bond pads, traces, and vias. Similarly, the dielectric region 108 can include a stack of dielectric materials, such as silicon oxide materials or other suitable dielectric materials. In the illustrated embodiment, a mask material 107 covers the electrode 106 and the dielectric region 108 to protect the electrode 106 and other features of the semiconductor device 100 during subsequent processing. Embodiments of the mask material 107 can include a silicon carbide hard mask or other suitable mask materials.

Figure 2:
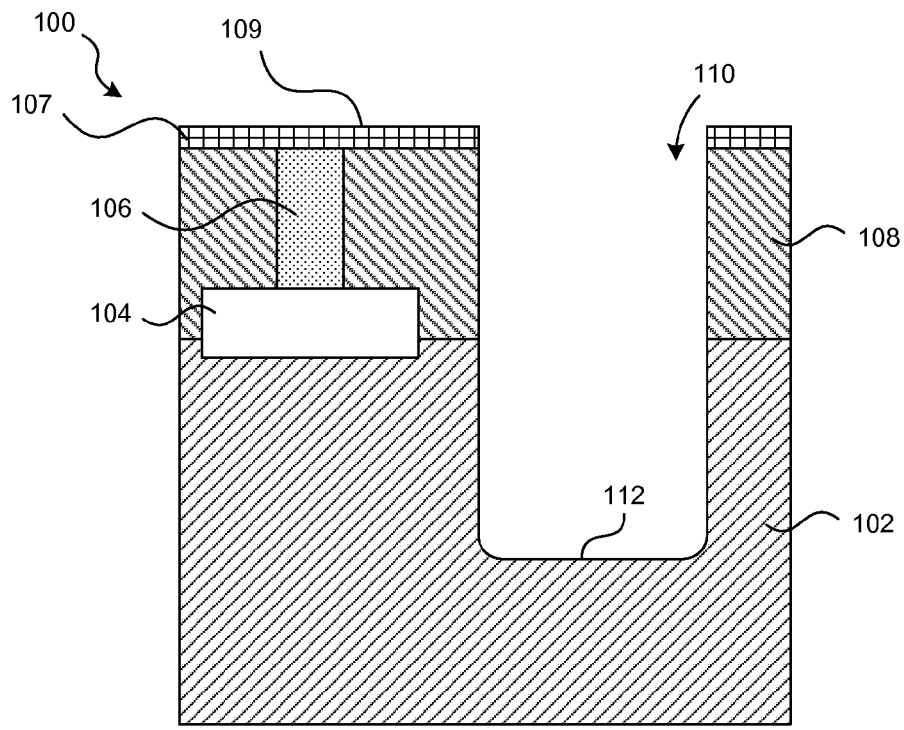

As shown in FIG. 2, an opening 110 can be formed through a front side 109 of the semiconductor device 100. The opening 110 extends through the mask material 107 and the dielectric region 108 and into the substrate 102. A plurality of openings 110 can be formed across the substrate 102 using, for example, photolithographic and etching processes. As shown, the photolithographic and etching processes define a sidewall extending to a depth within, but not completely through, the substrate 102. These processes also define a bottom surface 112 in the opening 110 of the substrate 102 such that the opening 110 is "blind" (e.g., not open at the backside of the substrate 102). In some embodiments, the opening 110 can be formed by more than one process, such as by a first etch process and a second etch process designed for etching through different types of dielectric, semiconductor, or other materials. Although, for simplicity of illustration, only one opening 110 is shown in the figures, the semiconductor device 100 can include a plurality of openings.

Figure 3:
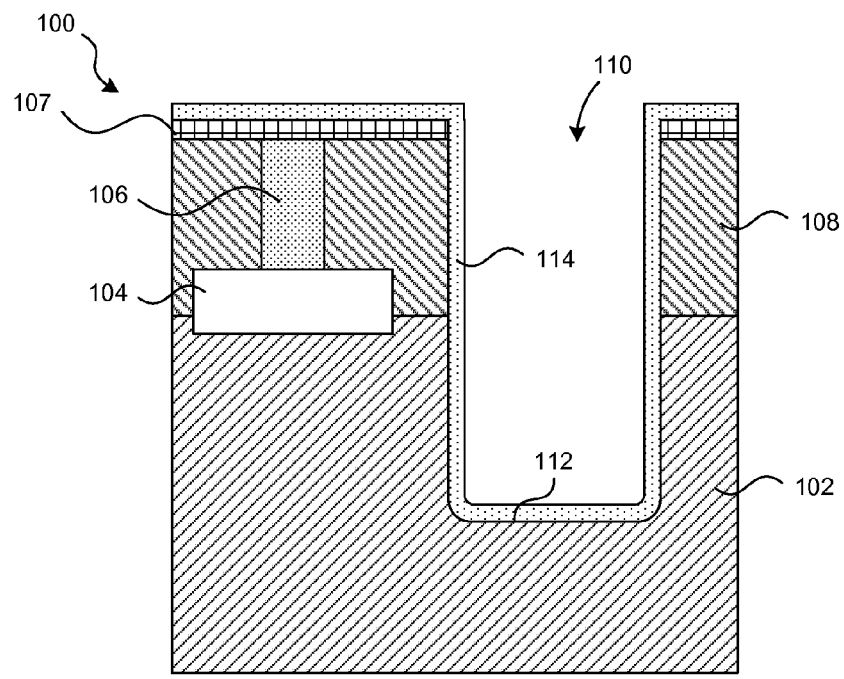

FIG. 3 shows the semiconductor device 100 after a dielectric liner 114 has been formed in the opening 110 and on the mask material 107. The dielectric liner 114 can be from about 0.05 micron to about 1.5 micron or from about 0.1 micron to about 0.4 micron to electrically isolate a conductive structure (not shown in FIG. 2) to be formed in the opening 110 from nearby structures. Suitable materials for the dielectric liner 114 include silicon dioxide, among others. As shown, the dielectric liner 114 can be deposited or grown. The dielectric liner 114 can also be etched using a spacer etch such that the dielectric liner 144 covers the sidewalls and the bottom surface 112 in the opening 110 but does not cover the mask material 107 outside the opening 110 or is thinner outside the opening 110 relative to inside the opening 110 (not shown in FIG. 3).

Figure 4:
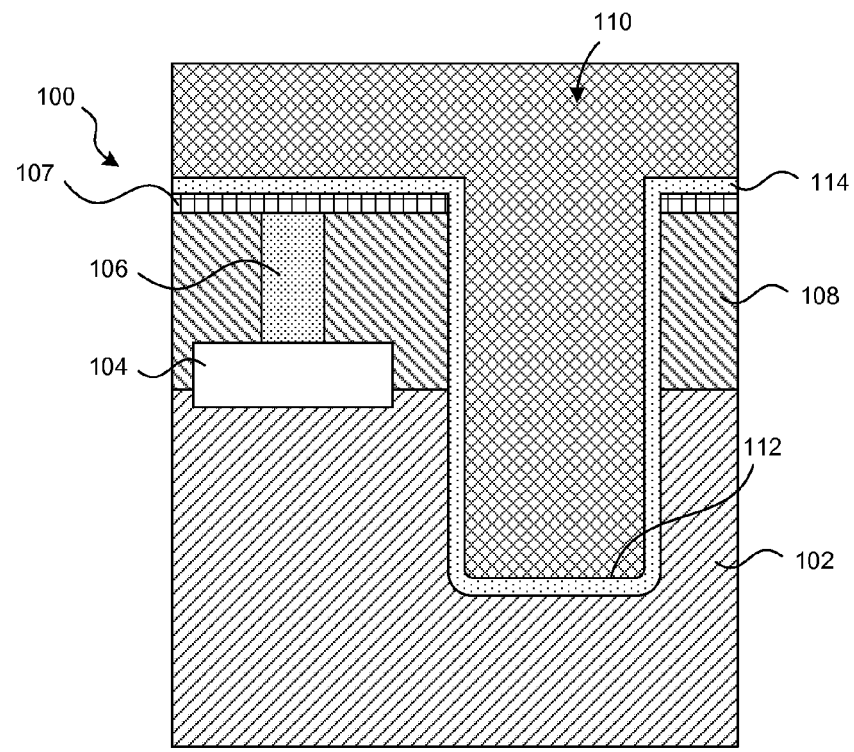

FIG. 4 shows the semiconductor device 100 after a sacrificial material 115 is deposited in the opening 110 and on the mask material 107 outside the opening 110. In one embodiment, the sacrificial material 115 can be polysilicon. For example, a low-pressure chemical-vapor deposition (LPCVD) process can form polysilicon in the opening 110 and on the mask material 107 outside the opening 110. In other embodiments, the sacrificial material 107 can include other suitable materials, such as silicon nitride or silicon oxide.

Figure 5:
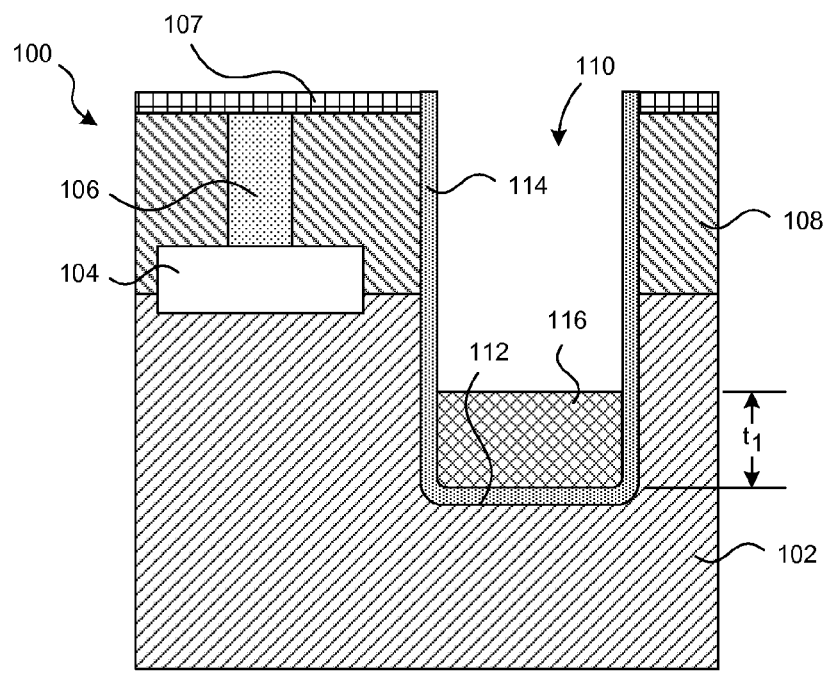

FIG. 5 shows the semiconductor device 100 including a sacrificial plug 116 on the bottom surface 112 that partially fills the opening 110. The excess sacrificial material outside the opening 110 can be removed in an etching process. Excess sacrificial material can also be removed from the opening 110. As discussed above, the sacrificial plug 116 can be configured to protect or mask the conductive structure formed in the opening 110 during a thinning process, such as a backgrinding process or other suitable thinning process. A height $t_1$ of the sacrificial plug 116 can be selected based on the amount of depth variation that occurs across a wafer or die when forming openings in the wafer or die, e.g., variation that occurs during an etch process. In addition or alternatively, the height $t_1$ can be selected based on the amount of surface height variation that occurs in a thinning process. As shown, a thinning process or another etching process has removed the dielectric liner from the mask material 107.

Figure 6:
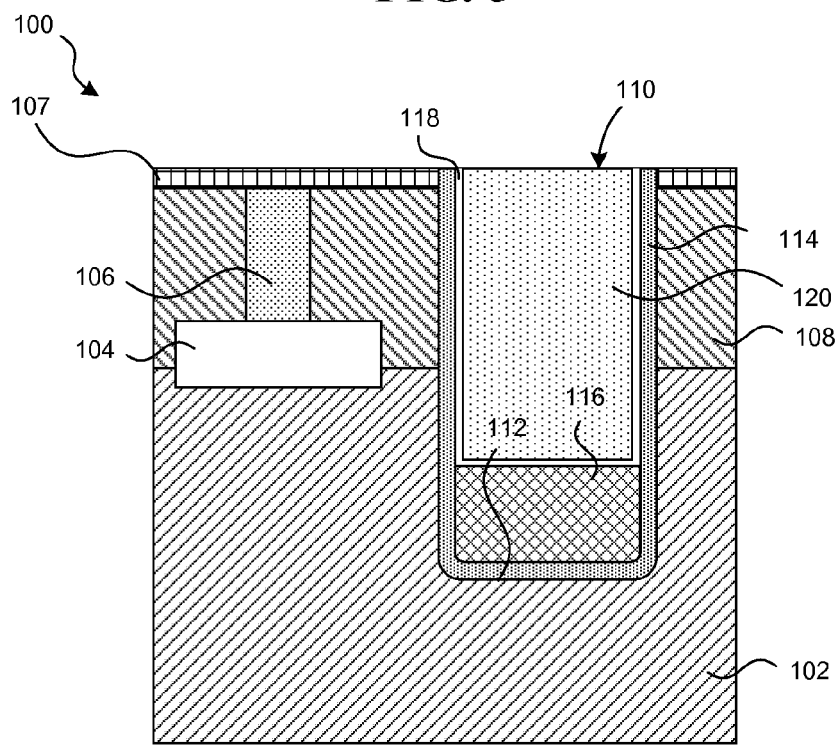

FIG. 6 shows the semiconductor device 100 after filling, or at least partially filling, the opening 110 with a conductive material 120. In one embodiment, a first barrier/seed material 118 can be formed on the dielectric liner 114 to seed formation of the conductive material 120 and reduce diffusion of the conductive material 120 through the substrate 102. In some embodiments, the first barrier/seed material 118 can have a barrier material that does not seed formation of the conductive structure, e.g., if the conductive structure is to be formed using chemical vapor deposition rather than plating. The barrier material, for example, can include tantalum, tantalum nitride, or another suitable material. The first barrier/seed material 118 can also include a seed material defined by a conductive material, e.g., copper or copper alloy. In some embodiments, the first barrier/seed material 118 can have only a single material that limits diffusion and seeds formation of a bulk conductive material. In other embodiments, the first barrier/seed material 118 can be omitted. As shown, a first conductive material 120 is deposited on the first barrier/seed material 118. The first conductive material 120 can be a metal, e.g., copper, copper alloy, or other suitable material.

Figure 7:
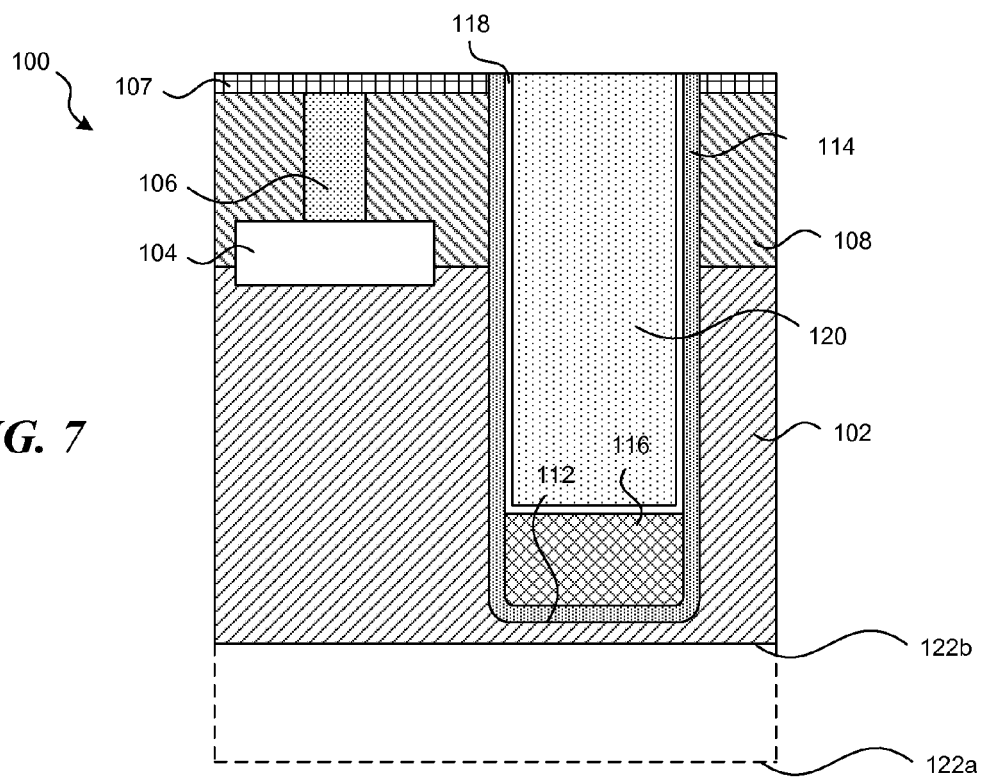

FIG. 7 shows the semiconductor device 100 after material has been removed from the first backside level 122a of the semiconductor device 100. In particular, a removal process has thinned the substrate 102 from the first backside level 122a to a second backside level 122b by stopping the removal process before all of the substrate material is removed from between the first backside level 122a and the sacrificial plug 116. The substrate 102 can be thinned by backgrinding, etching, chemical-mechanical planarization (CMP) and/or other suitable removal methods. In some embodiments, a thinning process may use the sacrificial plug 116 to detect when the thinning process should be stopped, such as an endpoint detection. In such embodiments, some of the sacrificial plugs on a wafer or die may be exposed through the substrate while others may not. In other embodiments, the thinning process may be a timed process designed so that few or none of the sacrificial plugs across a wafer or die are exposed through the substrate 102.

Figure 8:
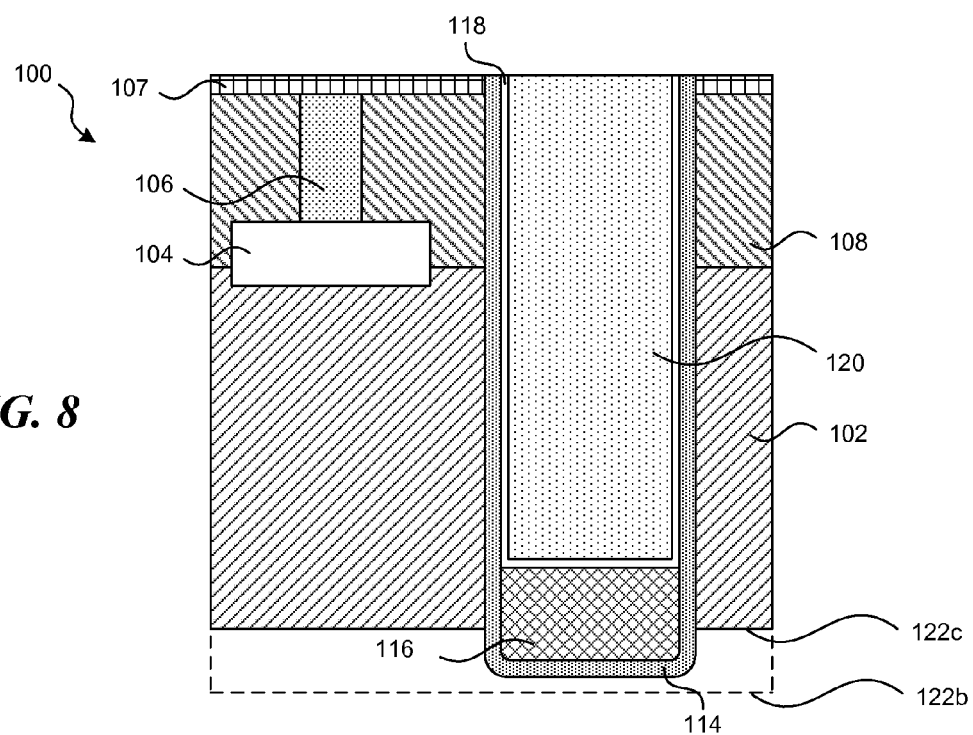

FIG. 8 shows the semiconductor device 100 after further material has been removed from the second backside level 122b of the substrate 102 to a third backside level 122c such that the sacrificial plug 116 projects beyond the third backside level 122c. As shown, a portion of the dielectric liner 114 on the sacrificial plug 116 is exposed. In other embodiments, the dielectric liner 114 may be removed, or at least partially removed. In general, one or more wet and/or dry chemical etching processes can be used to further remove the material of the substrate 102 and arrive at the third backside level 122c. For example, such etching processes may be selective to the substrate 102 over the material of the dielectric liner 114. In some embodiments, a CMP process can remove material from the substrate 102 and/or the dielectric liner 114. In other embodiments, an etch or thinning process occurs in a single process. For example, a single process can combine the process for thinning the substrate 102 to the second backside level 122b (FIG. 5) with the process for further removing material to the third backside level 122c.

Figure 9:
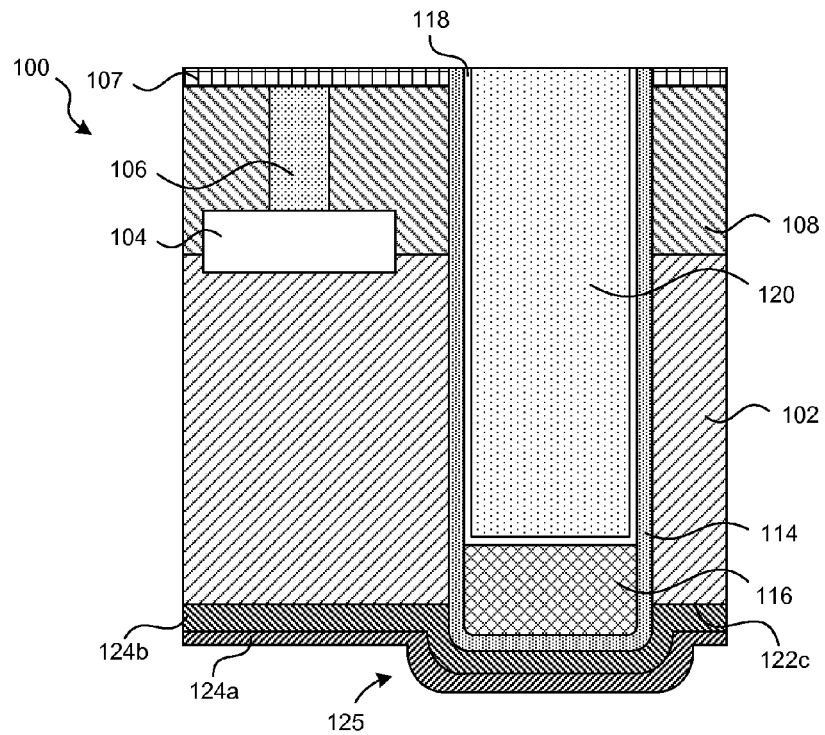

FIGS. 9-14 illustrate the semiconductor device 100 in various stages of forming a backside portion of through-substrate vias or other connectors that form backside electrical contact. In this example, a pillar or stand-off structure is formed at the third backside level 122c of the semiconductor device 100. FIG. 9 shows the semiconductor device 100 after a passivation material 124 is deposited on the sacrificial plug 116, the dielectric liner 114, and the third backside level 122c of the substrate 102 (identified individually in FIG. 9 as first and second passivation materials 124a and 124b). The passivation material 124 can be deposited in a low-temperature passivation process, such as an LPCVD process. In one embodiment, the first passivation material 124a is a silicon oxide film and the second passivation material 124b is a silicon nitride film. In other embodiments, other suitable materials may form a passivation material, including polysilicon. Also, in some embodiments, the passivation material 124 can include a single film of material. As illustrated, the passivation material 124 conforms to a surface of the substrate 102 and a surface defined by the sacrificial plug 116. The portion of the passivation material 124 covering the sacrificial plug 116 forms a topographical feature or projection 125 that can be planarized.

Figure 10:
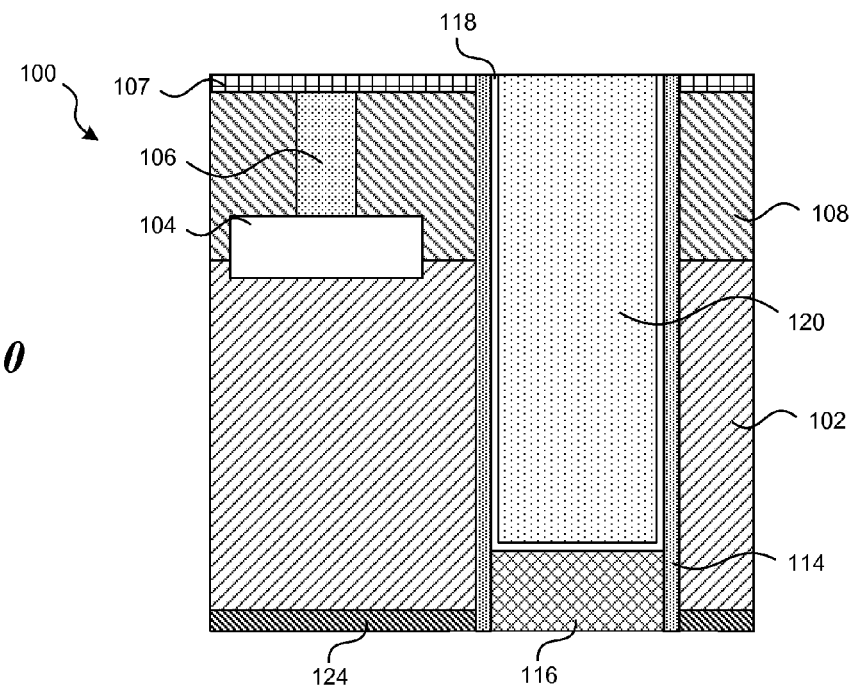

FIG. 10 shows the semiconductor device 100 after the passivation material 124, including the topographical feature 125 (FIG. 7), has been planarized by a CMP, backgrinding, fly-cut, or other suitable process. The planarization exposes the sacrificial plug 116 through the substrate 102 and the passivation material 124. In this embodiment, a portion of the dielectric liner 114 is also removed from the sacrificial plug 116. In other, non-illustrated embodiments, the dielectric liner 114, or at least a portion of the dielectric liner 114, can remain on the sacrificial plug 116 after planarization.

Figure 11:
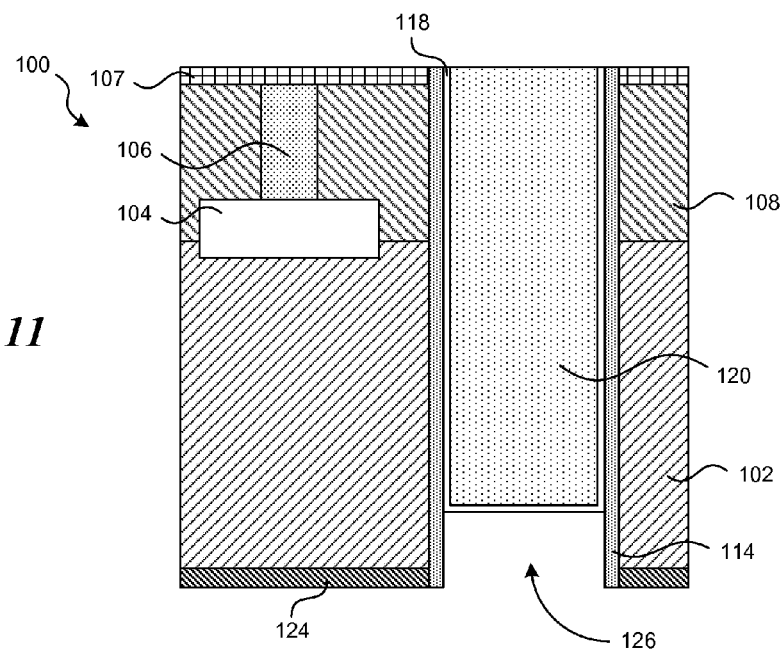

FIG. 11 shows the semiconductor device 100 after the sacrificial plug 116 (FIG. 8) has been removed from the semiconductor device 100. Removal of the sacrificial plug provides a void or opening 126 that exposes the first conductive material 120 and the first barrier/seed material 118 through the substrate 102. As will be described below, the void 126 provides a contact region for an electrical coupling with the first conductive material 120. One or more wet and/or dry chemical etches can remove material to form the void 126. In one embodiment, an etch is selective to the material of the sacrificial plug 116 over the passivation material 124 and the dielectric liner 114. In another embodiment, a photolithographic mask or the like can cover the passivation material 124 during an etch (not shown). In general, a suitable etch process can remove the sacrificial plug 116 without substantially degrading or oxidizing the first conductive material 120 in the void 126. In some embodiments, an etch or cleaning process can be applied in the void 126 to a surface of the first conductive material 120 to remove any native oxide or other material after the sacrificial plug is removed. For example, such a process could remove the portion of the first barrier/seed material 118 located in the void 126.

Figure 12:
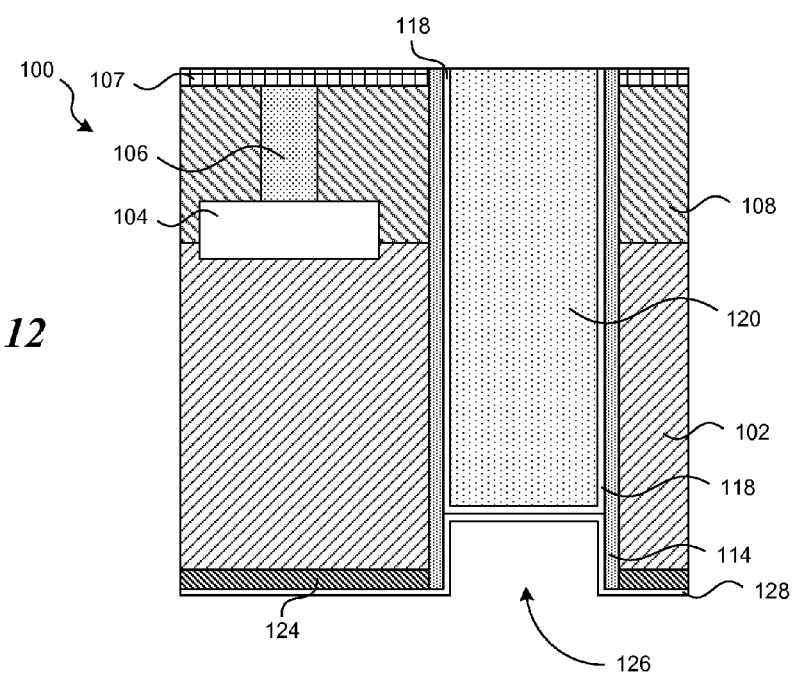

FIG. 12 shows the semiconductor device 100 after second barrier/seed material 128 has been deposited on the passivation material 124 and the first barrier/seed material 118 in the void 126. In some embodiments, the second barrier/seed material 128 includes a material similar to the first barrier/seed material 118. In other embodiments, the second barrier/seed material 128 includes a different material and/or is deposited by a different process than the first barrier/seed material 118. Also, in some embodiments, the second barrier/seed material 128 may be omitted from the semiconductor device 100.

Figure 13:
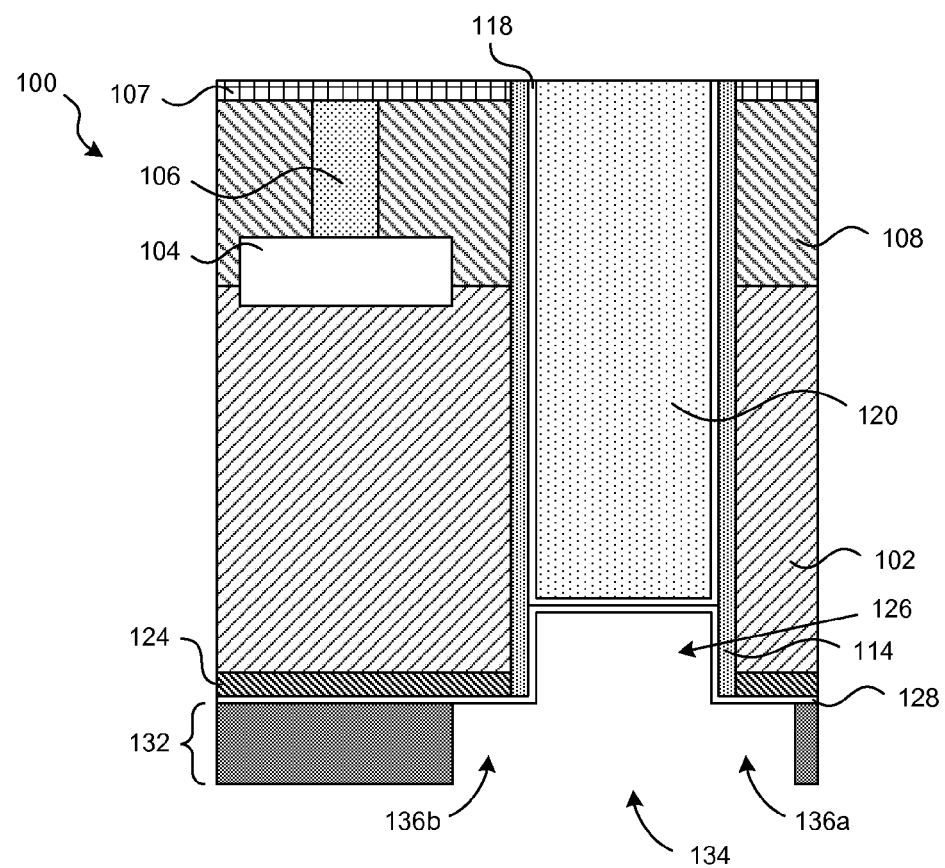

FIG. 13 shows the semiconductor device 100 after forming a photoresist mask 132 on the passivation material 124. The photoresist mask 132 defines a pattern having an opening 134 aligned with the void 126, and the opening 134 includes portions 136a and 136b outside the void 126. The opening 134 defines a portion of the shape of a conductive structure (not shown) that is formed in the opening 134 and the void 126.

Figure 14:
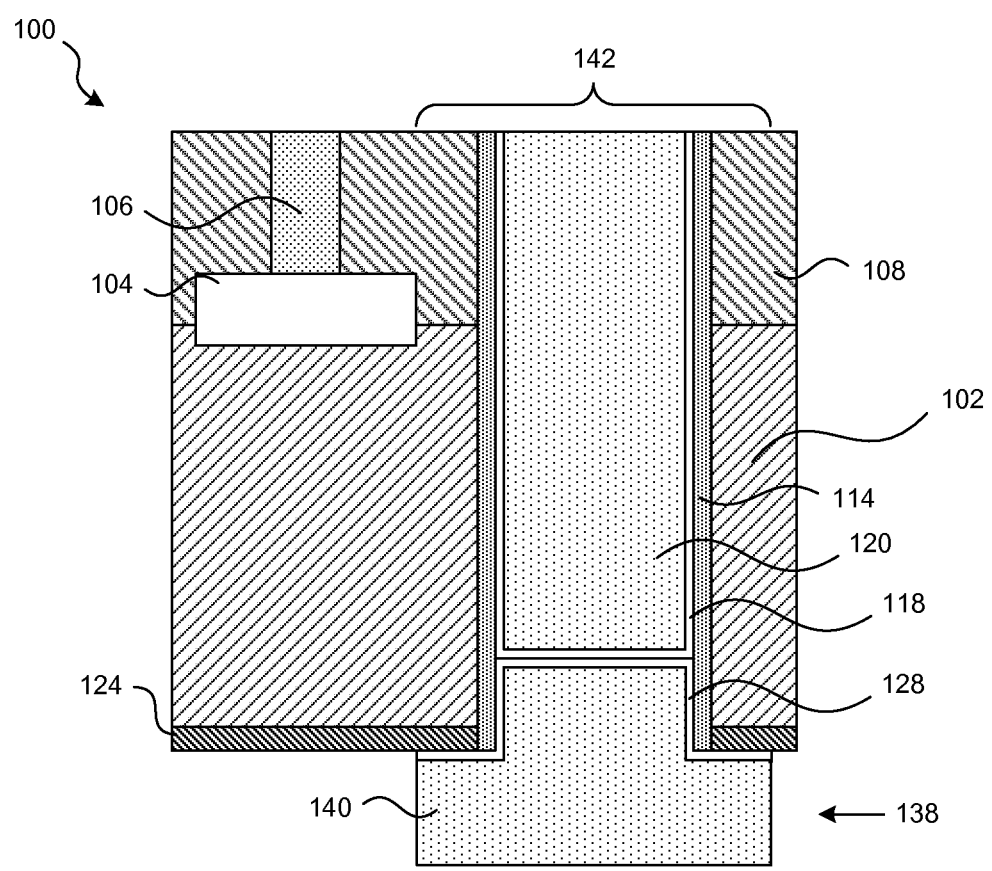

FIG. 14 shows the semiconductor device 100 after removing the mask material 107 (FIG. 13), such as by an etch or other suitable process, and forming a conductive structure 138, e.g., a pillar or stand-off structure. The conductive structure 138 includes a second conductive material 140, which can include metal, e.g., copper, copper alloy, or other suitable material that can be the same or different material than the first conductive material 120. An electroplating process can form the conductive structure 138 by initially depositing the second conductive material 140 on the photoresist mask 132 (FIG. 11) and on the second barrier/seed material 128 exposed through the opening 134 (FIG. 11) of the photoresist mask 132. A lift off process can next remove the photoresist mask 132 and the second conductive material 140 deposited on the mask. The conductive structure 138 includes the remaining second conductive material 140 that is not lifted off. An etch or other process can remove excess second barrier/seed material 128 outside of the conductive structure 138. In other embodiments, other deposition and/or patterning techniques can form the conductive structure 138. For example, in some embodiments the conductive material may be deposited before the photoresist mask 132. An etch, in this example, could be used in lieu of the lift-off process.

According to embodiments of the present technology, a through-substrate via 142 can include the first conductive material 120 and the second conductive material 140. As shown, the first seed/barrier material 118 and the second seed/barrier material 128 provide an electrical coupling between the first and second conductive materials 120 and 140 at an interior portion of the substrate 102. In other embodiments, and depending on the fabrication process, one or both of the first and second seed/barrier materials 118 and 128 may be omitted. For example, a seed/barrier material may be omitted if one (or both) of the first and second conductive materials 120 and 140 is deposited by a non-plating process.

FIGS. 15-19 are partially schematic cross-sectional views illustrating a portion of a semiconductor device 200 in another method for making through-substrate vias or other connectors in accordance with another embodiment of the present technology. FIGS. 15-19 illustrate the semiconductor device 200 in various states of forming a backside portion of through-substrate vias or other connectors that form backside electrical contact. In this example, a damascene structure is formed at the backside of the semiconductor device.

Figure 15:
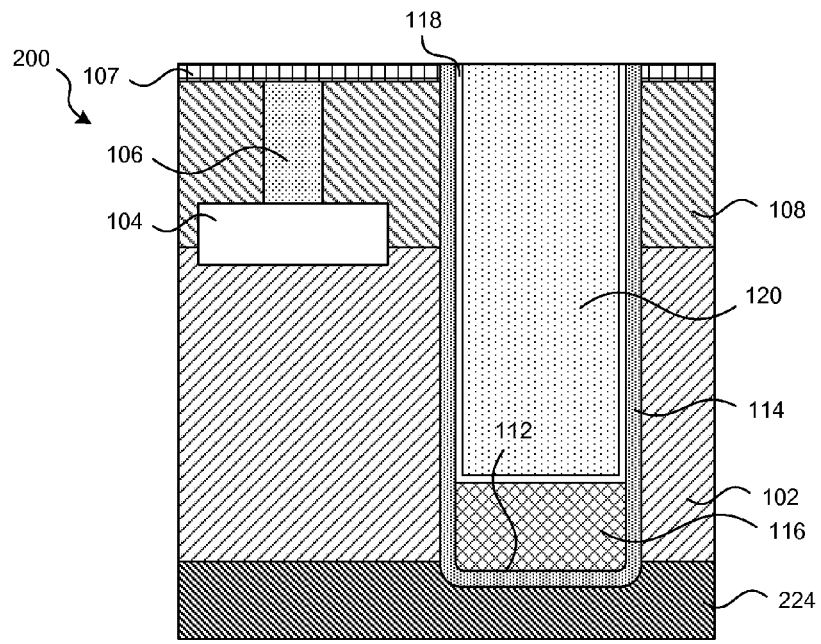
FIGS. 15-19 are partially schematic cross-sectional views illustrating a semiconductor device at selected steps in another method for making conductive structures in accordance with an embodiment of the present technology.

Referring to FIG. 15, the semiconductor device 200 at this stage of the process is similar to the semiconductor device 100 in FIG. 9, but the semiconductor device 200 has a thicker passivation material 224 that can be planarized by a CMP process or other suitable process to form a planar surface on the passivation material 224 without exposing the dielectric liner 114. In some embodiments, the planarization process can be omitted. For example, the sacrificial plug 116 may produce negligible surface topography or the topography may not substantially interfere with subsequent photolithography or other subsequent processing.

Figure 16:
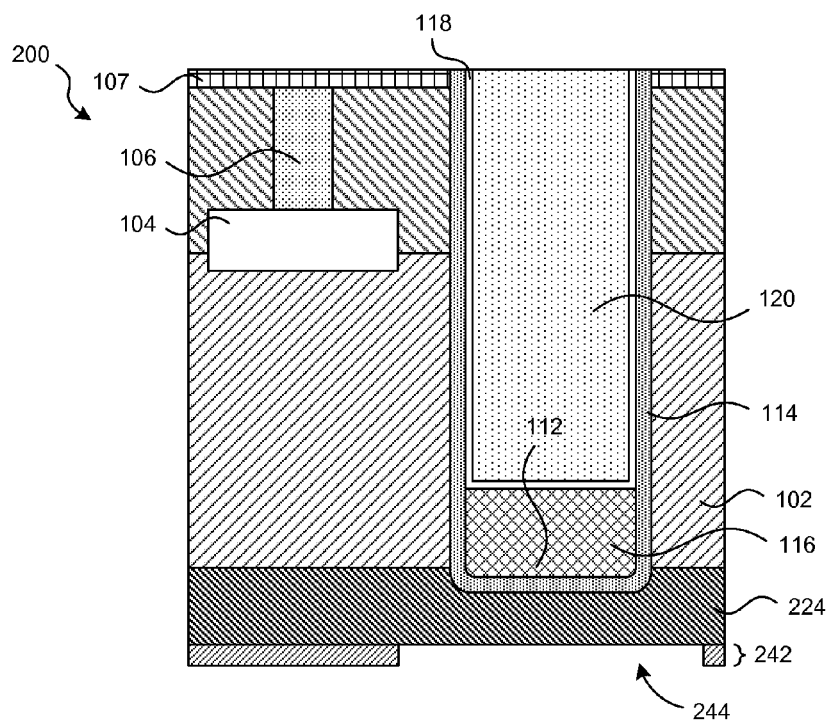
Figure 17:
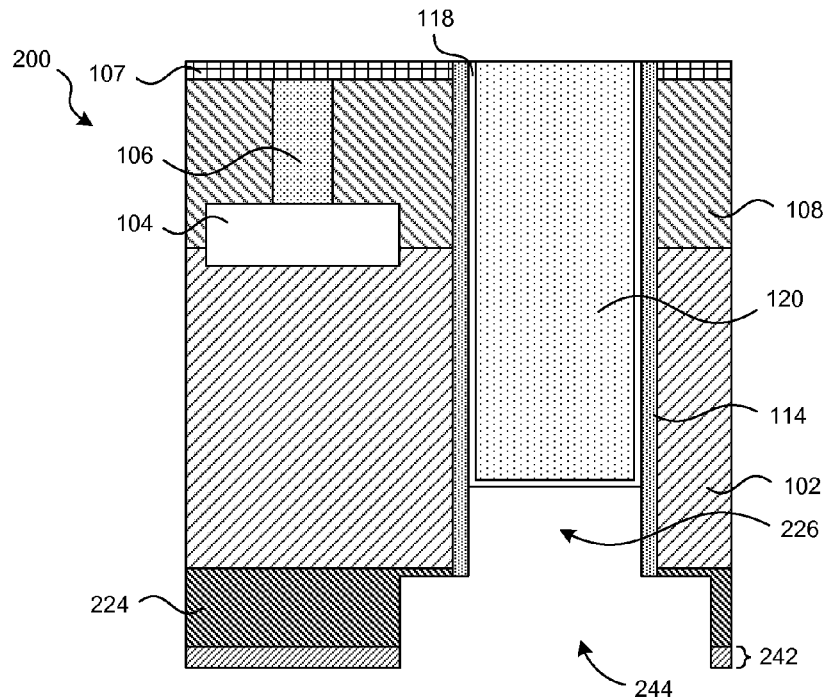

FIG. 16 shows the semiconductor device 200 after forming a photoresist mask 242 on the passivation material 224. The photoresist mask 242 has patterning that defines an opening 244 that is aligned with the sacrificial plug 116. FIG. 17 shows the semiconductor device 200 after the pattern of the opening 244 has been transferred to the passivation material 224 and a void 226 has been formed by removing the sacrificial plug 116 (FIG. 15). For example, one or more wet and/or dry chemical etches can remove material to transfer the pattern of the opening 244 to the passivation material 224 and to form the void 226. In one embodiment, a single etch process can remove material to form the pattern of the opening 244 and the void 226. In another embodiment, a multi-step etch process can be employed.

Figure 18:
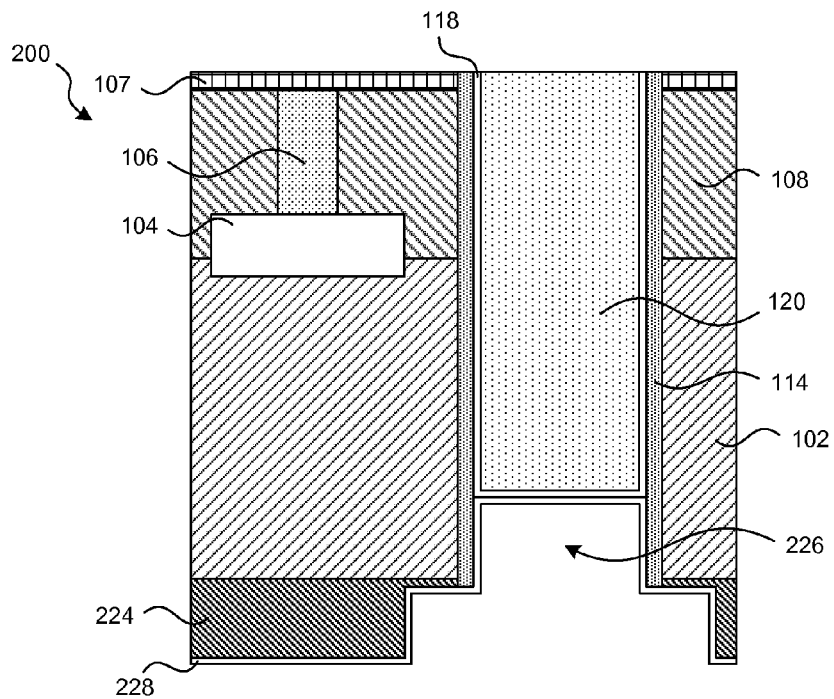

FIG. 18 shows the semiconductor device 200 after the photoresist mask 242 (FIG. 15) has been removed and a second barrier/seed material 228 has been deposited on the passivation material 124, the first barrier/seed material 128, and the second barrier/seed material 228 in the void 226. In some embodiments, the second barrier/seed material 228 includes a material similar to the first barrier/seed material 118. In other embodiments, the second barrier/seed material 228 includes different materials and/or is deposited by a different process.

Figure 19:
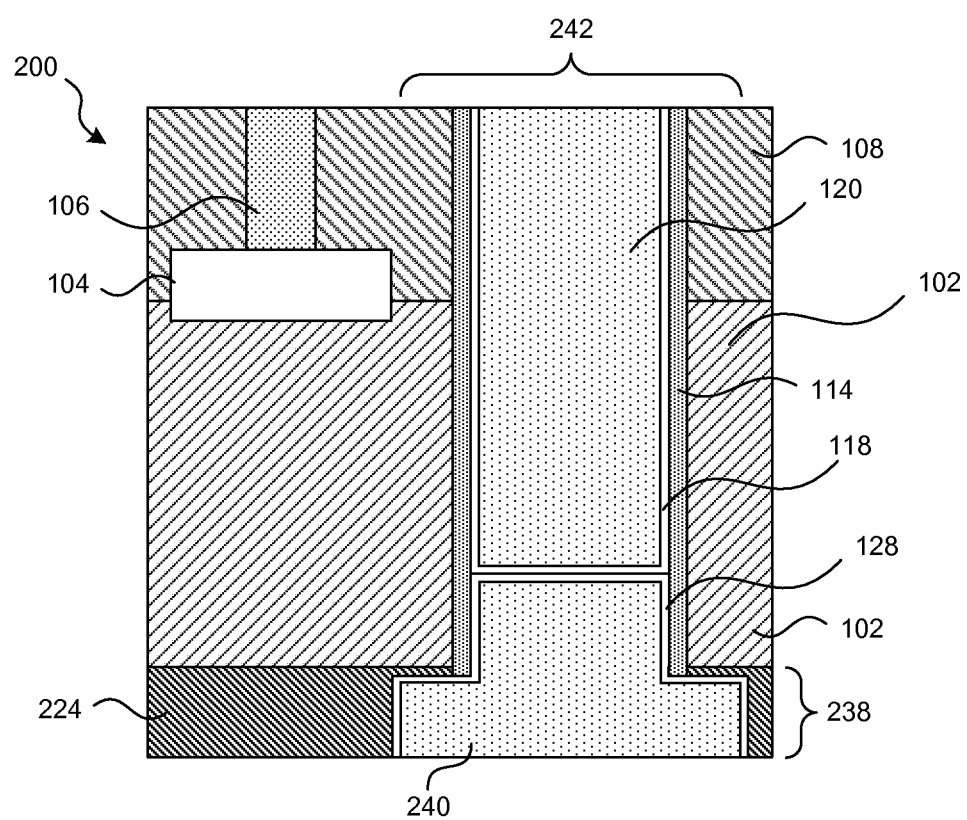

FIG. 19 shows the semiconductor device 200 after forming a damascene structure 238. The damascene structure 238 includes a second conductive material 240, which can include metal, e.g., copper, copper alloy, or other suitable material, that is the same or different material than the first conductive material 120. An electroplating process or other suitable process fills the second conductive material 240 in the void 226 and the pattern of the opening 244 (FIG. 18) defined in the passivation material 224. A planarization process, such as CMP, can remove excess second conductive material 240 and excess second seed material 228 on the passivation material 224. For example, the planarization process can planarize a wafer carrying the semiconductor device 200 until the second conductive material 240 is completely removed from the passivation material 224.

Similar to the through-substrate via 142 (FIG. 14), a through-substrate via 242 can include the first conductive material 120 and the second conductive material 240. As shown, the first seed/barrier material 118 and the second seed/barrier material 228 provide an electrical coupling between the first and second conductive materials 120 and 240 at an interior portion of the substrate 102. In other embodiments, and depending on the fabrication processes, one or both of the first and second seed/barrier materials 118 and 228 may be omitted. For example, seed/barrier material may be omitted if one of the first and second conductive materials 120 and 240 is deposited by a non-plating process.

Figure 20A:
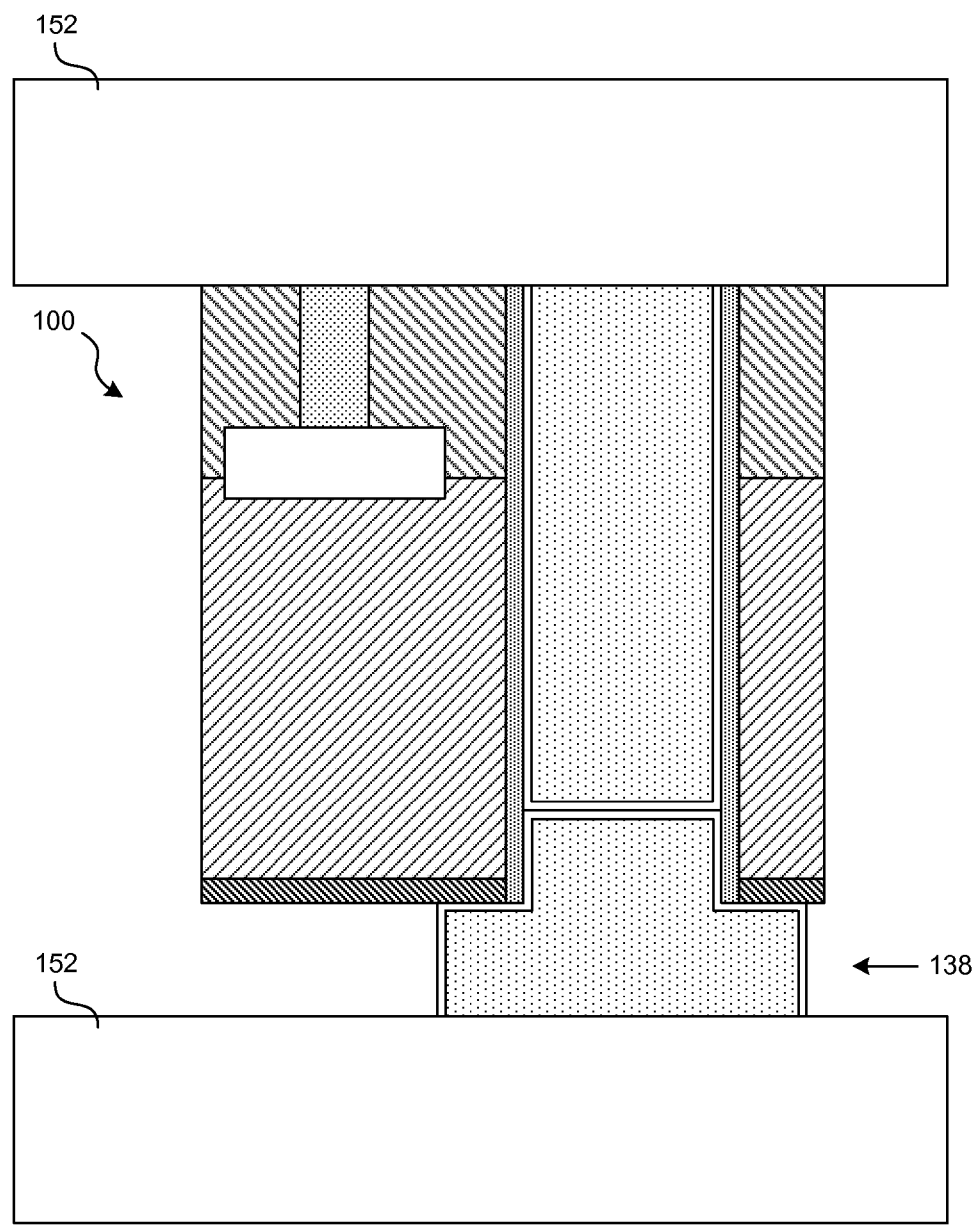
FIGS. 20A and 20B are a partially schematic cross-sectional view illustrating semiconductor devices made by the methods shown in FIGS. 1-19.
Figure 20B:
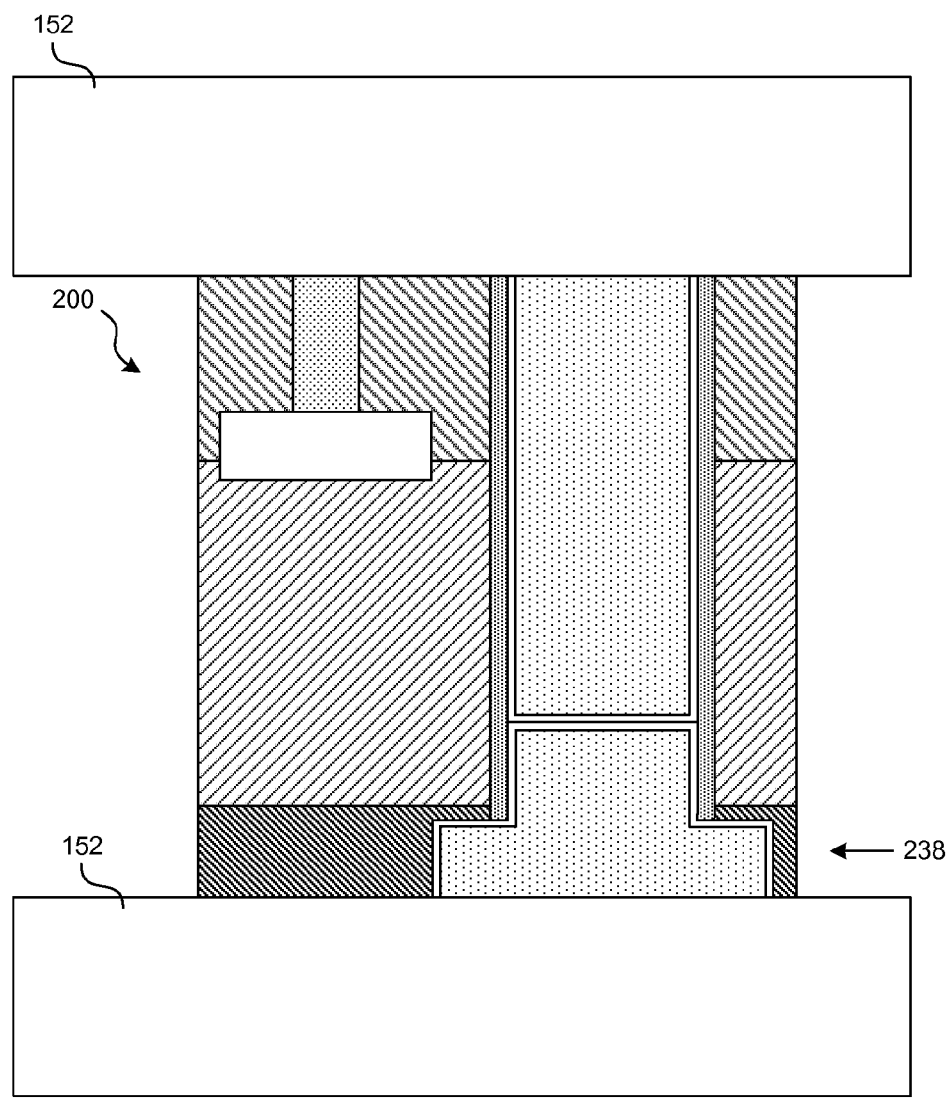

FIGS. 20A and 20B are partially schematic cross-sectional views illustrating, respectively, the semiconductor devices 100 and 200 after additional processing before packaging. Additional dielectric and metallization structures 150 and 152 (shown schematically) can be coupled to the conductive structure 138 and the damascene structure 238 to complete a suitable network of electrical connections within the semiconductor devices 100 and 200. The semiconductor devices 100 and 200 can be incorporated alone or with other semiconductor devices into a suitable package (not shown). For example, the conductive structure 138 and the damascene structure 238 can be connected to leads (not shown) of the package using wire bonds (not shown), solder bumps (not shown), or other suitable structures. The semiconductor devices 100 and 200 and other associated structures can also be encapsulated for protection and to facilitate heat dissipation during operation.

Figure 21:
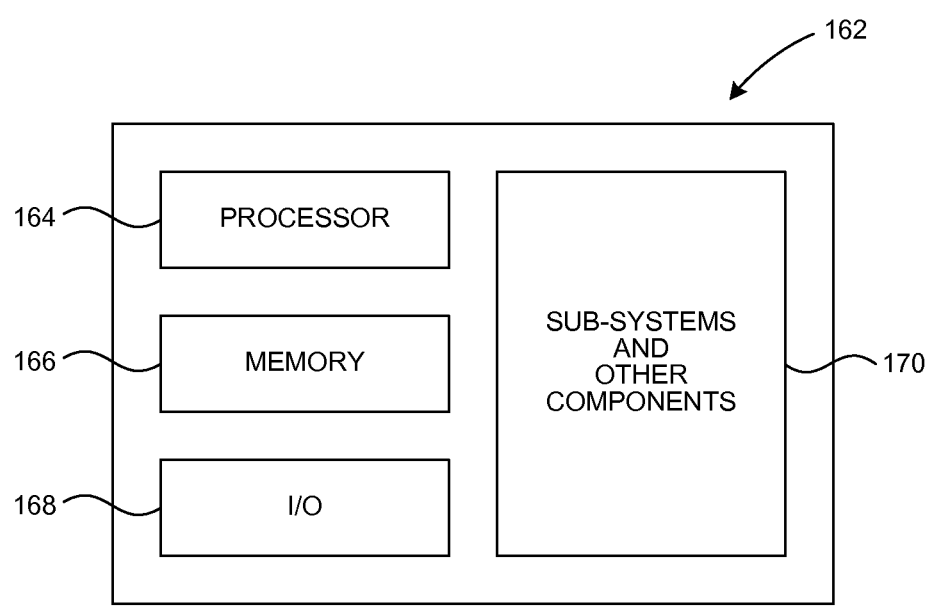
FIG. 21 is a block diagram illustrating a system that incorporates a semiconductor device in accordance with an embodiment of the present technology.

Any one of the semiconductor devices having the features described above with reference to FIGS. 1-20B can be incorporated into any of a myriad of larger and/or more complex systems, a representative example of which is system 162 shown schematically in FIG. 21. The system 162 can include a processor 164, a memory 166 (e.g., SRAM, DRAM, flash, and/or other memory devices), input/output devices 168, and/or other subsystems or components 170. The semiconductor devices 100 and 200 described above with reference to FIGS. 1-20B can be included in any of the elements shown in FIG. 21. The resulting system 162 can be configured to perform any of a wide variety of suitable computing, processing, storage, sensing, imaging, and/or other functions. Accordingly, representative examples of the system 162 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 162 include lights, cameras, vehicles, etc. With regard to these and other examples, the system 162 can be housed in a single unit or distributed over multiple interconnected units, e.g., through a communication network. The components of the system 162 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A semiconductor device comprising:
   a substrate having an opening extending from a front side of the substrate to a backside of the substrate, wherein the opening includes a first portion at the front side and a second portion at the backside that has a different shape than the first portion of the opening;
   a through-substrate via that extends through the opening, wherein the thorough-substrate via includes—
      a first conductive material extending through the opening at the front side of the substrate,
      a second conductive material extending through the opening at the backside of the substrate, and
      at least one barrier/seed material between the first conductive material and the second conductive material; and
   a conductive structure that includes the second conductive material, wherein the conductive structure includes a pillar or stand-off structure,
   wherein the first portion of the opening at least partially defines a first conductive structure that includes the first conductive material, and wherein the second portion of the opening at least partially defines a second conductive structure that includes the second conductive material.

2. The semiconductor device of claim 1 wherein the barrier/seed material is positioned in the opening at an interior portion of the substrate.

3. The semiconductor device of claim 1 wherein the at least one barrier/seed material includes a first barrier/seed material, and wherein the through-substrate via includes a second/barrier seed material between the first barrier/seed material and the second conductive material.

4. The semiconductor device of claim 1, further comprising a dielectric material disposed between the substrate and the second conductive material.

5. The semiconductor device of claim 4 wherein the substrate includes a sidewall in the opening extending between the front side and the backside, and wherein at least a portion of the dielectric material extends along the sidewall.

6. The semiconductor device of claim 4 wherein at least a portion of the dielectric material extends over the backside of the substrate.

7. The semiconductor device of claim 6 wherein the dielectric material includes a silicon oxide film.

8. The semiconductor device of claim 1 wherein the through-substrate via comprises a through-silicon via.

9. A semiconductor device package, comprising a first semiconductor device, a second semiconductor device, and a conductive structure between the first and second semiconductor devices, wherein the second semiconductor device includes a substrate and through-silicon via of which the conductive structure forms a part of, and wherein:
   the substrate has an opening extending from a front side of the substrate to a backside of the substrate, wherein the opening includes a first portion at the front side and a second portion at the backside that has a different shape than the first portion;
   the through-silicon via includes—
      a first conductive material extending through the opening at the front side of the substrate and having a first shape defined by the first portion of the opening,
      a second conductive material extending through the opening at the backside of the substrate and having a second shape defined by the second portion of the opening, wherein the second shape is different than the first shape, and
      at least one barrier/seed material between the first conductive material and the second conductive material; and
   the conductive structure includes a pillar or standoff structure formed from a portion of the second conductive material.

10. The semiconductor device package of claim 9 wherein the second semiconductor device comprises a memory device.

11. The semiconductor device package of claim 10 wherein the first semiconductor device comprises a memory device.

12. The semiconductor device package of claim 9, further comprising a passivation material disposed between the substrate and a portion of the second conductive material.

13. The semiconductor device package of claim 12 wherein the substrate includes a sidewall in the opening extending between the front side and backsides, wherein the semiconductor device further comprises a dielectric liner extending along the sidewall, and wherein the dielectric liner is disposed between the substrate and a portion of the second conductive material.

14. A semiconductor device, comprising:
- a substrate having a first side, a second side opposite the first side, and an opening extending from the first side to the second side, wherein the opening includes a first portion proximate the first side, and a second portion proximate the second side;
- a through-silicon via extending through the opening, wherein the through silicon via includes—
  - a first conductive material in the first portion of the opening, the first conductive material having a first shape defined by the first portion of the opening,
  - a second conductive material in the second portion of the opening, the second conductive material having a second shape different than the first shape, the second shape defined by the second portion of the opening, and
  - a third conductive material in the opening between the first and second conductive materials; and
- a conductive structure that includes a portion of the second conductive material, wherein the second conductive structure includes a pillar or standoff structure.

15. The semiconductor device of claim 14, further comprising a passivation material over the second side of the substrate, wherein a portion of the second conductive structure projects from the second side and beyond the passivation material.

16. The semiconductor device of claim 14 wherein the third conductive material includes at least one of a barrier material and a seed material.

17. The semiconductor device of claim 14 wherein the third conductive material includes a first barrier/seed material, and wherein the through-silicon via further comprises a second barrier/seed material between the first barrier seed/material and the second conductive material.

* * * * *